United States Patent
Byoun et al.

(10) Patent No.: US 11,373,678 B2
(45) Date of Patent: Jun. 28, 2022

(54) DATA STORAGE DEVICE USING WINDOWED DELTA-SIGMA ANALOG-TO-DIGITAL CONVERTER IN DIGITAL CURRENT CONTROL LOOP

(71) Applicant: Western Digital Technologies, Inc., San Jose, CA (US)

(72) Inventors: Jaesoo Byoun, Irvine, CA (US); Naoyuki Kagami, Fujisawa (JP); Gaku Ikedo, Chigasaki (JP)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/178,307

(22) Filed: Feb. 18, 2021

(65) Prior Publication Data

US 2022/0084548 A1   Mar. 17, 2022

Related U.S. Application Data

(60) Provisional application No. 63/079,616, filed on Sep. 17, 2020.

(51) Int. Cl.
| | | |
|---|---|---|
| G11B 5/54 | (2006.01) |
| G11B 5/55 | (2006.01) |
| G11B 5/596 | (2006.01) |
| H03M 1/12 | (2006.01) |
| G11B 5/35 | (2006.01) |

(52) U.S. Cl.
CPC ............ *G11B 5/59666* (2013.01); *G11B 5/35* (2013.01); *G11B 5/5573* (2013.01); *G11B 5/59622* (2013.01); *H03M 1/12* (2013.01)

(58) Field of Classification Search
CPC ....... G11B 5/09; G11B 20/0013; G11B 20/18; G11B 5/00; G11B 5/54; G11B 5/5552; G11B 33/08; G11B 19/2027; G11B 5/5521; G11B 5/5569
USPC .............. 360/75, 78.05, 97.19, 264.7, 294.3
See application file for complete search history.

(56) References Cited

U.S. PATENT DOCUMENTS

| | | |
|---|---|---|
| 6,188,347 B1 | 2/2001 | Knudsen |
| 6,566,838 B2 | 5/2003 | Maiocchi |
| 7,073,113 B2 | 7/2006 | Sayed et al. |
| 7,710,092 B2 | 5/2010 | Chapuis et al. |
| 9,742,430 B1 * | 8/2017 | Barrenscheen ....... H03M 3/462 |

* cited by examiner

*Primary Examiner* — Nabil Z Hindi
(74) *Attorney, Agent, or Firm* — Patterson + Sheridan, LLP; Steven H. VerSteeg

(57) ABSTRACT

A data storage device is disclosed comprising a voice coil motor (VCM) configured to actuate a head over a disk. The data storage device further comprises control circuitry comprising a digital current control loop including a windowed delta-sigma analog-to-digital converter (ADC) configured to control the VCM. A vibration of the data storage device is measured, and at least one of a gain or a window of the windowed delta-sigma ADC is configured based on the measured vibration.

20 Claims, 4 Drawing Sheets

DATA STORAGE DEVICE USING WINDOWED DELTA-SIGMA ANALOG-TO-DIGITAL CONVERTER IN DIGITAL CURRENT CONTROL LOOP

CROSS REFERENCE TO RELATED APPLICATIONS

This application claims priority to U.S. Provisional Patent Application Ser. No. 63/079,616, filed on Sep. 17, 2020, which is hereby incorporated by reference in its entirety.

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

DETAILED DESCRIPTION

Figure 2A:
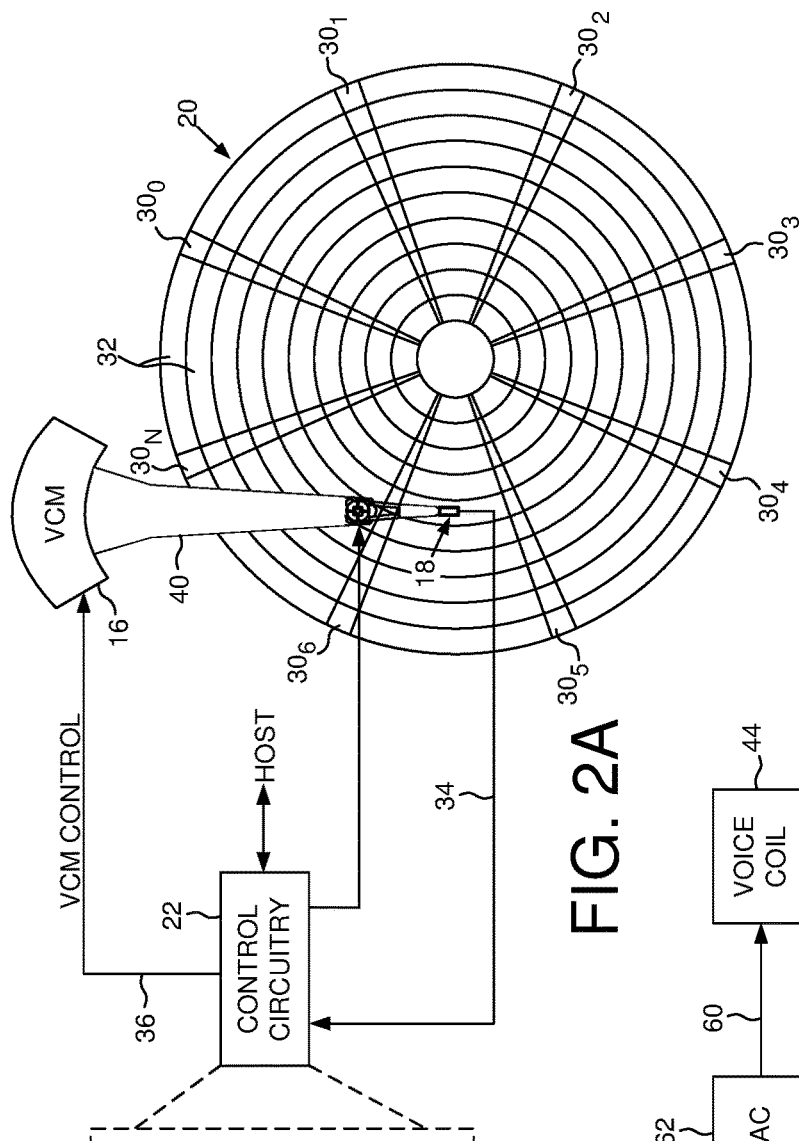
FIG. 2A shows a data storage device in the form of a disk drive according to an embodiment comprising a head actuated over a disk by a voice coil motor (VCM).
Figure 2B:
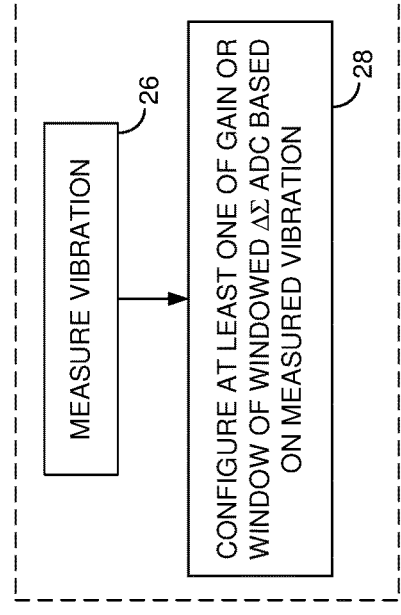
FIG. 2B is a flow diagram according to an embodiment wherein at least one of a gain or window of a windowed delta-sigma analog-to-digital converter (ADC) is configured based on a measured vibration.

FIG. 2A shows a data storage device in the form of a disk drive according to an embodiment comprising a voice coil motor (VCM) 16 configured to actuate a head 18 over a disk 20. The disk drive further comprises control circuitry 22 comprising a digital current control loop (e.g., FIG. 2C) including a windowed delta-sigma analog-to-digital converter (ADC) 24 configured to control the VCM 16. In one embodiment the control circuitry 22 is configured to execute the flow diagram of FIG. 2B, wherein a vibration of the data storage device is measured (block 26), and at least one of a gain or a window of the windowed delta-sigma ADC is configured based on the measured vibration (block 28).

Figure 1:
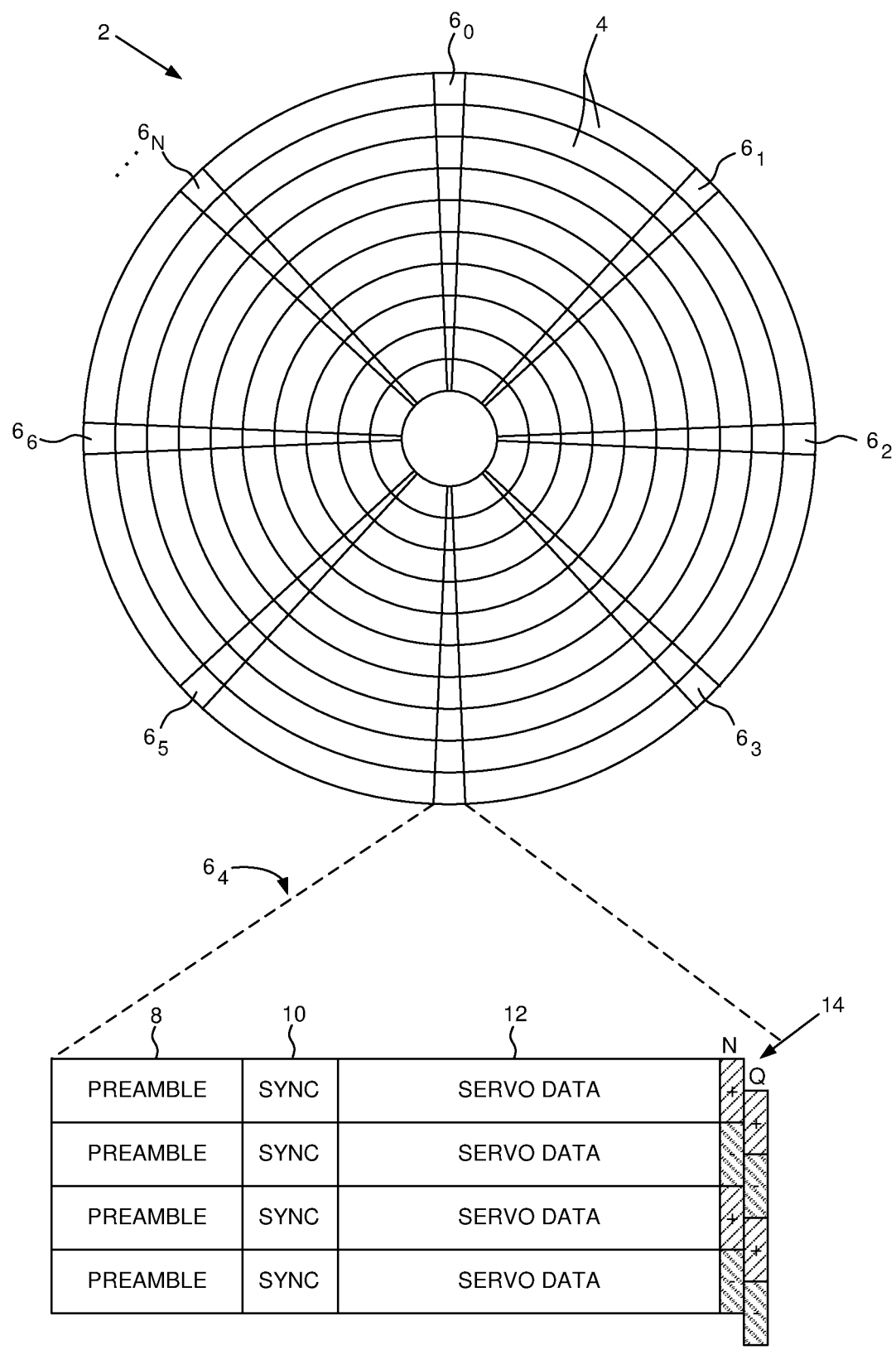
FIG. 1 shows a prior art disk format comprising a plurality of servo tracks defined by servo sectors.

In the embodiment of FIG. 2A, the disk 20 comprises a plurality of servo sectors $30_0$-$30_N$ that define a plurality of servo tracks, wherein data tracks 32 are defined relative to the servo tracks at the same or different radial density. The control circuitry 22 processes a read signal 34 emanating from the head to demodulate the servo sectors and generate a position error signal (PES) representing an error between the actual position of the head and a target position relative to a target track. A servo control system in the control circuitry 22 filters the PES using a suitable compensation filter to generate a control signal 36 applied to the VCM 16 which rotates an actuator arm 40 about a pivot in order to actuate the head radially over the disk in a direction that reduces the PES. The head may also be servoed using a fine actuator, such as a piezoelectric (PZT) actuator, configured to actuate a suspension relative to the actuator arm 40, and/or configured to actuate the head relative to the suspension. The servo sectors $30_0$-$30_N$ may comprise any suitable head position information, such as a track address for coarse positioning and servo bursts for fine positioning. The servo bursts may comprise any suitable pattern, such as an amplitude based servo pattern or a phase based servo pattern (FIG. 1).

Figure 2C:
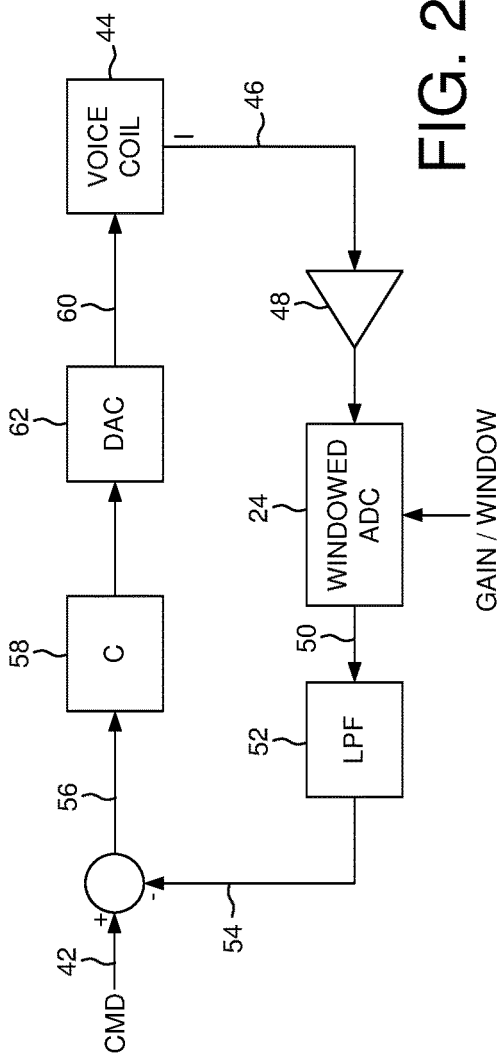
FIG. 2C shows a digital current control loop comprising a windowed delta-sigma ADC for controlling the VCM according to an embodiment.

FIG. 2C shows an embodiment of a digital current control loop for controlling the VCM 16, wherein a command value 42 is generated by a servo control system in response to the measured PES. The command value 42 represents a target current flowing through the voice coil 44 of the VCM 16. The actual current 46 flowing through the voice coil 44 is measured using a transimpedance amplifier 48 the output of which is converted to a digital value 50 by the windowed delta-sigma ADC 24. The digital value 50 is filtered with a low-pass filter (LPF) 52 to generate a digital measured current 54 representing the current 46 flowing through the voice coil 44. The digital measured current 54 is subtracted from the target command value 42 to generate an error value 56. The error value 56 is filtered using a suitable compensator 58 the output of which is converted into an analog value 60 by a digital-to-analog converter (DAC) 62.

In one embodiment, the windowed delta-sigma ADC 24 such as shown in FIG. 2C operates linearly (e.g., unity gain) when the input value is inside a window region and operates non-linearly (e.g., non-unity gain) when the input value is outside the window region. This improves the performance of the digital current control loop in terms of higher resolution, higher linearity, and lower noise when the amplitude of the input signal is smaller and the bandwidth requirement of the control loop is reduced (e.g., when tracking the centerline of a data track during access operations). When the amplitude of the input signal increases (e.g., during seek operations or when a vibration is affecting the disk drive), performance is improved by increasing the gain of the windowed delta-sigma ADC 24 so as to increase the bandwidth and decrease the phase delay of the control loop.

Figure 2D:
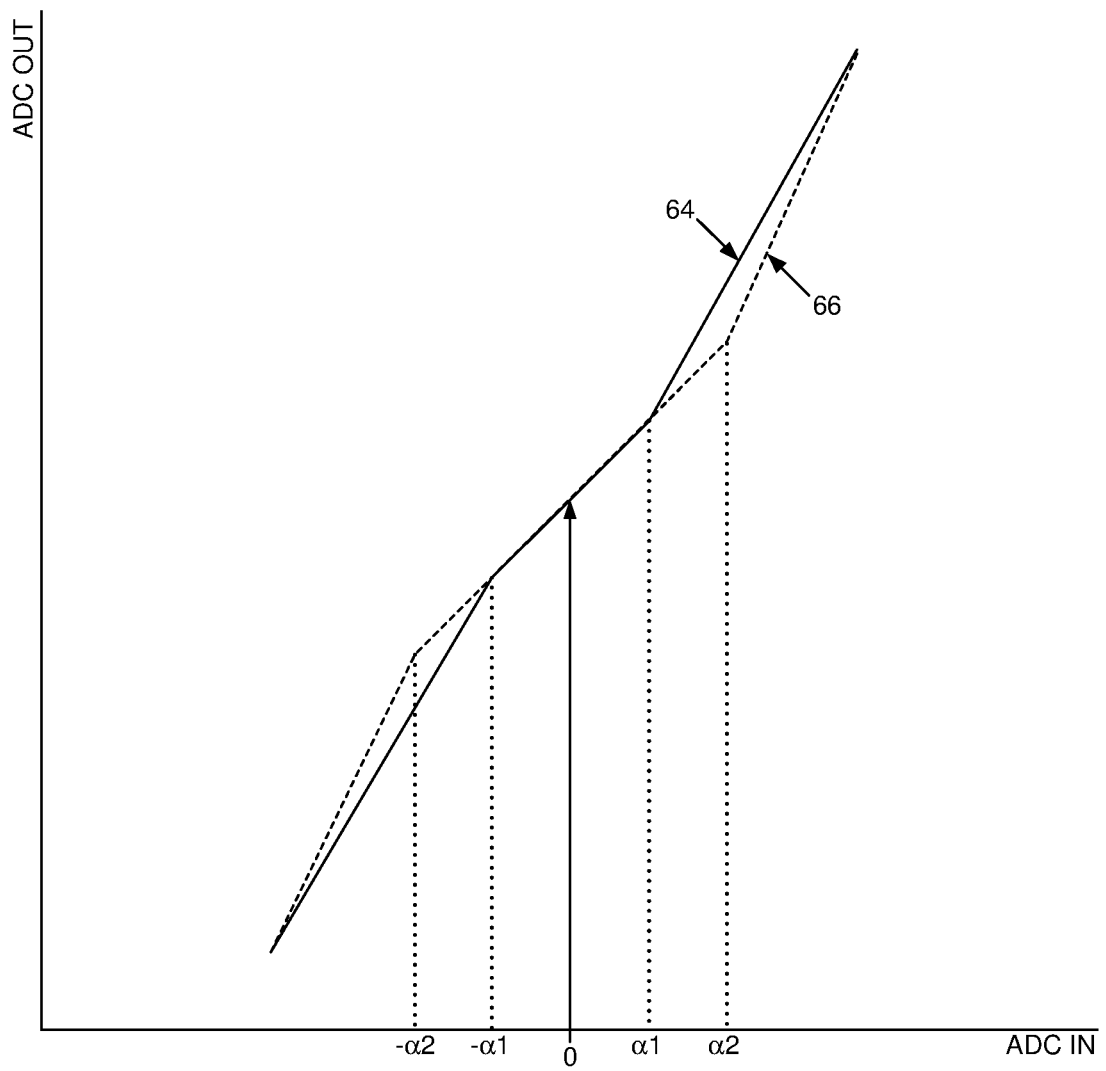
FIG. 2D shows a transfer function of the windowed delta-sigma ADC including a linear operating region inside a window and a non-linear operating region outside the window.

FIG. 2D shows example transfer functions for the windowed delta-sigma ADC 24, including a first transfer function 64 having a linear gain inside a first window region defined by an input range from $-\alpha 1$ to $+\alpha 1$ and a non-linear (higher) gain outside the first window region, and a second transfer function 66 having a linear gain inside a second window region defined by an input range from $-\alpha 2$ to $+\alpha 2$ and a non-liner (higher) gain outside the second window region. In one embodiment, the transfer function of the windowed delta-sigma ADC 24 is configurable, such as by configuring at least one of the gain or the window shown in FIG. 2D. For example, in one embodiment the non-linear gain and/or the window of the windowed delta-sigma ADC may be calibrated during a manufacturing procedure and/or calibrated or dynamically tuned while the disk drive is deployed in the field in order to optimize the frequency response of the digital servo control loop. For example, a suitable quality metric may be measured (e.g., the PES) while preforming seeking and tracking operations and the non-linear gain adjusted and/or the window adjusted until the measured quality metric achieves a suitable level. In one embodiment, the gain of the windowed delta-sigma ADC 24 may also be calibrated and/or tuned for the small signal region (input values inside the window). That is, in one embodiment the small signal gain may be configured to a value other than the unity gain shown in the example transfer functions of FIG. 2D.

In one embodiment, the gain and/or width of the window of the windowed delta-sigma ADC 24 may be configured based on the operating environment of the disk drive (e.g., based on the ambient temperature or the amplitude of vibrations affecting the disk drive). For example, in one embodiment the width of the window may be decreased and/or the non-linear gain outside the window region may be increased when the data storage device is operating in a higher vibration environment in order to optimize the overall frequency response of the digital current control loop. In one embodiment, the gain and or the window width of the windowed delta-sigma ADC 24 may be configured dynamically as the environmental conditions (e.g., the ambient temperature, amplitude of the vibrations, etc.) may change over time.

Figure 3:
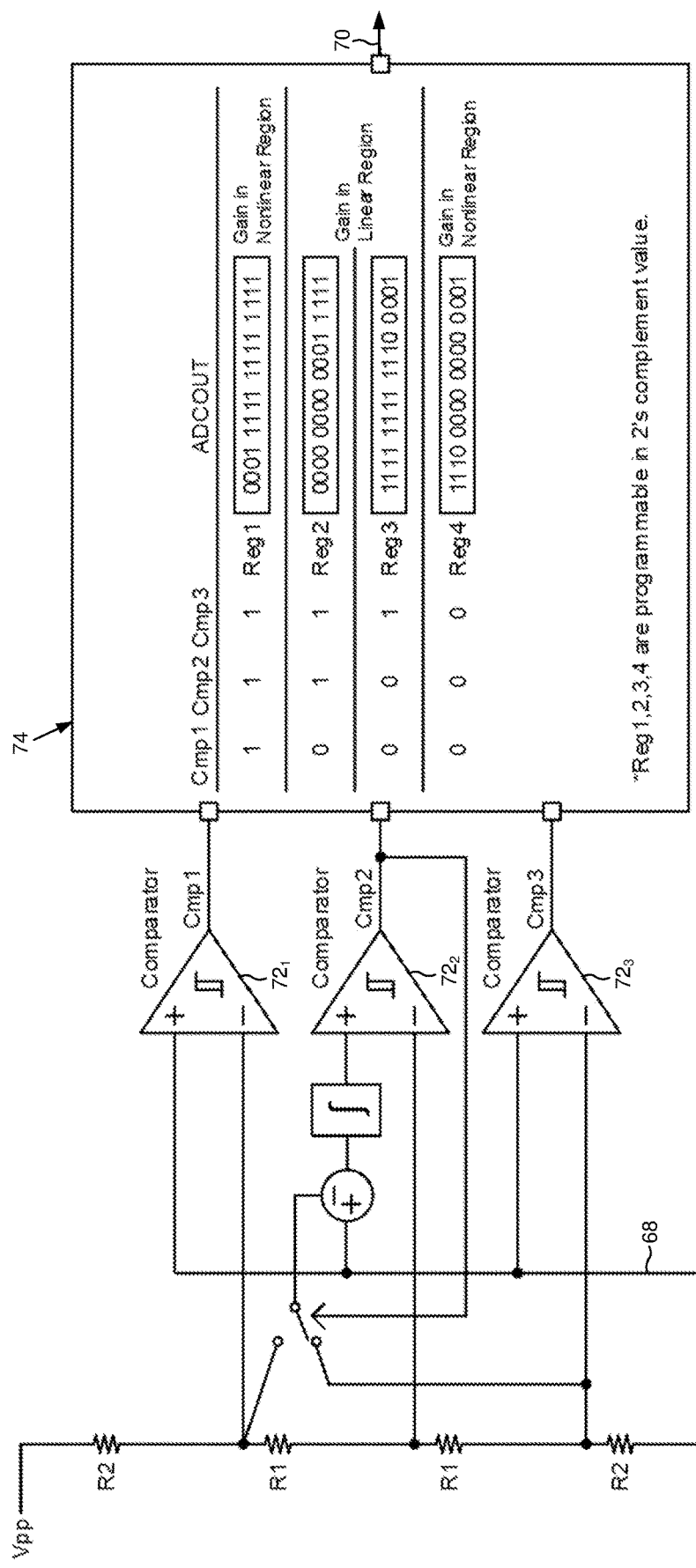
FIG. 3 shows an embodiment wherein at least one of a gain or a window of a windowed delta-sigma ADC is configurable.

FIG. 3 shows an example of a windowed delta-sigma ADC 24 according to an embodiment for converting an analog input value 68 into a multi-bit digital output value 70 (which is filtered by a low-pass filter such as shown in FIG. 2C to generate the final output value). In the embodiment of FIG. 3, a plurality of resistors {R1, R2} are configured to generate threshold values for respective comparators $72_1$-$72_3$, wherein the ratio of the R1 to R2 resistors defines the width of the window for the windowed delta-sigma ADC 24 (i.e., defines the a values shown in FIG. 2D). In one embodiment, the resistors {R1, R2} are programmable so that the width of the window may be calibrated or tuned as described above. The outputs of the comparators $72_1$-$72_3$ are decoded 74 into one of four digital values stored by respective registers {Reg1, Reg2, Reg3, Reg4}. In this embodiment, the first register Reg1 stores a digital value corresponding to the large signal gain for a large positive input value outside the window, the second register Reg2 stores a digital value corresponding to the small signal gain for a small positive input value inside the window, the third register Reg3 stores a 2's compliment digital value corresponding to the small signal gain for a small negative input value, and the fourth register Reg4 stores a 2's compliment digital value corresponding to the large signal gain for a large negative input value. In one embodiment, the decoder 74 registers are programmable so that the small signal gain and/or the large signal gain may be calibrated or tuned as described above. The digital values stored in the decoder 74 registers shown in FIG. 3 are representative values illustrating the 2's compliment conversion for negative input values; however, any suitable values may be employed and these values may by calibrated and/or tuned as described above.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In yet another embodiment, the control circuitry comprises suitable logic circuitry, such as state machine circuitry. In some embodiments, at least some of the flow diagram blocks may be implemented using analog circuitry (e.g., analog comparators, timers, etc.), and in other embodiments at least some of the blocks may be implemented using digital circuitry or a combination of analog/digital circuitry.

In addition, any suitable electronic device, such as computing devices, data server devices, media content storage devices, etc. may comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
    a disk;
    a head;
    a voice coil motor (VCM) configured to actuate the head over the disk;
    control circuitry comprising a digital current control loop including a windowed delta-sigma analog-to-digital converter (ADC) configured to control the VCM, wherein the control circuitry is configured to:
    measure a vibration of the data storage device; and
    configure at least one of a gain or a window of the windowed delta-sigma ADC based on the measured vibration.

2. The data storage device as recited in claim 1, wherein the control circuitry is further configured to decrease the window of the windowed delta-sigma ADC when the measured vibration increases.

3. The data storage device as recited in claim 1, wherein the control circuitry is further configured to increase the gain of the windowed delta-sigma ADC when the measured vibration increases.

4. The data storage device as recited in claim 1, wherein the windowed delta-sigma ADC operates linearly when an input value is inside the window and operates non-linearly when the input value is outside the window.

5. The data storage device as recited in claim 4, wherein:
    the windowed delta-sigma ADC operates inside the window while tracking a centerline of a data track on the disk during an access operation; and
    the windowed delta-sigma ADC operates outside the window while seeking the head over the disk.

6. The data storage device as recited in claim 1, wherein the windowed delta-sigma ADC comprises:
    a plurality of comparators configured to compare an input value to respective thresholds; and
    a plurality of resistors configured to generate the thresholds.

7. The data storage device as recited in claim 6, wherein the control circuitry is further configured to program the plurality of resistors in order to configure the window of the windowed delta-sigma ADC.

8. The data storage device as recited in claim 1, wherein the windowed delta-sigma ADC comprises a plurality of registers each configured to store a multibit value corresponding to a threshold level of an input value.

9. The data storage device as recited in claim 8, wherein the control circuitry is further configured to program the plurality of registers in order to configure the gain of the windowed delta-sigma ADC.

10. The data storage device as recited in claim 8, wherein the control circuitry further comprises a low pass filter configured to filter the multibit values to generate a digital value representing a measured current of the VCM.

11. A windowed delta-sigma analog-to-digital converter (ADC) comprising:
    a plurality of comparators configured to compare an input value to respective thresholds;
    a plurality of resistors configured to generate the thresholds, wherein the resistors define a window of the windowed delta-sigma ADC;
    a plurality of registers each configured to store a multibit value corresponding to one of the thresholds, wherein the multibit values define a gain of the windowed delta-sigma ADC; and
    a low pass filter configured to filter the multibit values.

12. The windowed delta-sigma ADC as recited in claim 11, wherein the plurality of resistors are programmable in order to configure the window of the windowed delta-sigma ADC.

13. The windowed delta-sigma ADC as recited in claim 11, wherein the plurality of registers are programmable in order to configure the gain of the windowed delta-sigma ADC.

14. The windowed delta-sigma ADC as recited in claim 11, wherein the multibit values consist of 2's complement values corresponding to positive and negative input values.

15. The windowed delta-sigma ADC as recited in claim 11, wherein:
    the windowed delta-sigma ADC operates linearly when the input value is inside the window; and
    the windowed delta-sigma ADC operates non-linearly when the input value is outside the window.

16. A data storage device comprising:
    a disk;
    a head;
    a voice coil motor (VCM) configured to actuate the head over the disk;
    a digital current control loop including a windowed delta-sigma analog-to-digital converter (ADC) configured to control the VCM;
    a means for measuring a vibration of the data storage device; and
    a means for configuring at least one of a gain or a window of the windowed delta-sigma ADC based on the measured vibration.

17. The data storage device as recited in claim 16, further comprising a means for increasing the window of the windowed delta-sigma ADC when the measured vibration increases.

18. The data storage device as recited in claim 16, further comprising a means for decreasing the gain of the windowed delta-sigma ADC when the measured vibration increases.

19. The data storage device as recited in claim 16, wherein the windowed delta-sigma ADC operates linearly when an input value is inside the window and operates non-linearly when the input value is outside the window.

20. The data storage device as recited in claim 19, wherein:
    the windowed delta-sigma ADC operates inside the window while tracking a centerline of a data track on the disk during an access operation; and
    the windowed delta-sigma ADC operates outside the window while seeking the head over the disk.

* * * * *